(12) United States Patent
Harrison et al.

(10) Patent No.: US 11,664,715 B2
(45) Date of Patent: May 30, 2023

(54) POWER ELECTRONICS ASSEMBLY HAVING A POTTED HIGH VOLTAGE ATTENUATOR CARD FOR A WIND TURBINE

(71) Applicant: General Electric Company, Schenectady, NY (US)

(72) Inventors: John Springer Harrison, Roanoke, VA (US); Benjamin Arthur Niemoeller, Roanoke, VA (US); Stephen D. Nash, Salem, VA (US); Robert Gregory Wagoner, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 754 days.

(21) Appl. No.: 16/687,817

(22) Filed: Nov. 19, 2019

(65) Prior Publication Data
US 2021/0152059 A1    May 20, 2021

(51) Int. Cl.
*H02M 1/06*    (2006.01)
*H02M 1/00*    (2006.01)

(52) U.S. Cl.
CPC ................................. *H02M 1/0006* (2021.05)

(58) Field of Classification Search
CPC .................................................. H02M 1/0006
USPC ............................................................ 361/18
See application file for complete search history.

(56) References Cited

U.S. PATENT DOCUMENTS

| | | | |
|---|---|---|---|
| 3,931,456 A | 1/1976 | McChesney, Jr. | |
| 7,071,579 B2* | 7/2006 | Erdman | F03D 7/048 290/55 |
| 10,156,224 B2* | 12/2018 | Chacon | F03D 7/0224 |
| 2015/0092376 A1 | 4/2015 | Arens et al. | |
| 2018/0026563 A1* | 1/2018 | Schnetzka | H02P 9/007 290/44 |

FOREIGN PATENT DOCUMENTS

| | | |
|---|---|---|
| EP | 1515145 A1 | 3/2005 |
| EP | 3223024 A1 | 9/2017 |
| EP | 3499246 A1 | 6/2019 |

OTHER PUBLICATIONS

European Search Report for EP Application No. 20208688.0 dated Apr. 9, 2021.

* cited by examiner

*Primary Examiner* — Yemane Mehari
(74) *Attorney, Agent, or Firm* — Dority & Manning, P.A.

(57) ABSTRACT

A power electronics assembly for a power generation system includes a housing and an attenuator card positioned within the housing. The attenuator card may include at least one printed circuit board for a high-voltage attenuator circuit. The power electronics assembly also includes a potting material at least partially filling the housing on one or more sides of the attenuator card, a detachable end cap positioned at a first end of the housing, and multi-phase wiring communicatively coupled to the high-voltage attenuator circuit through the end cap.

16 Claims, 7 Drawing Sheets

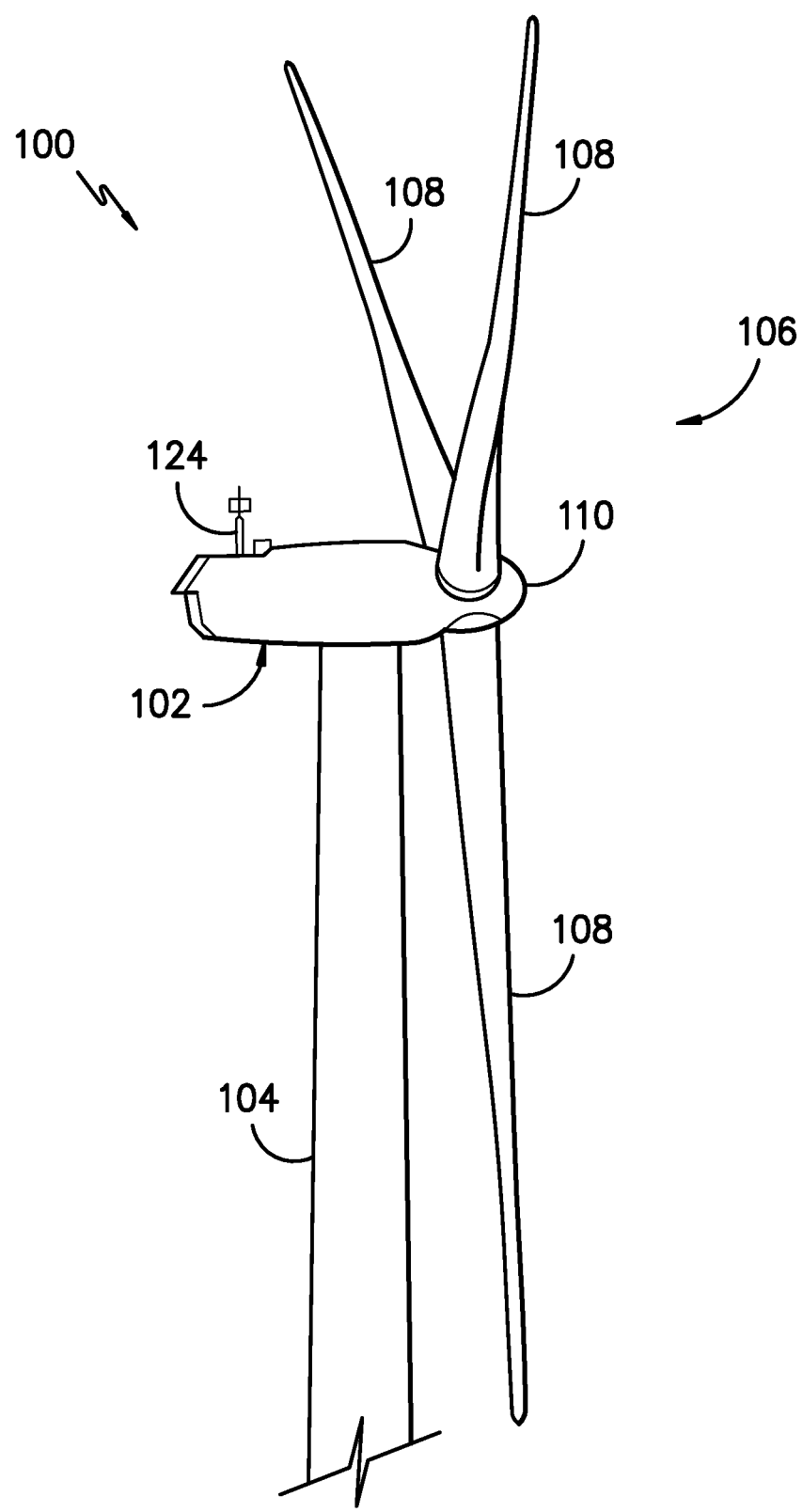
FIG. -1-

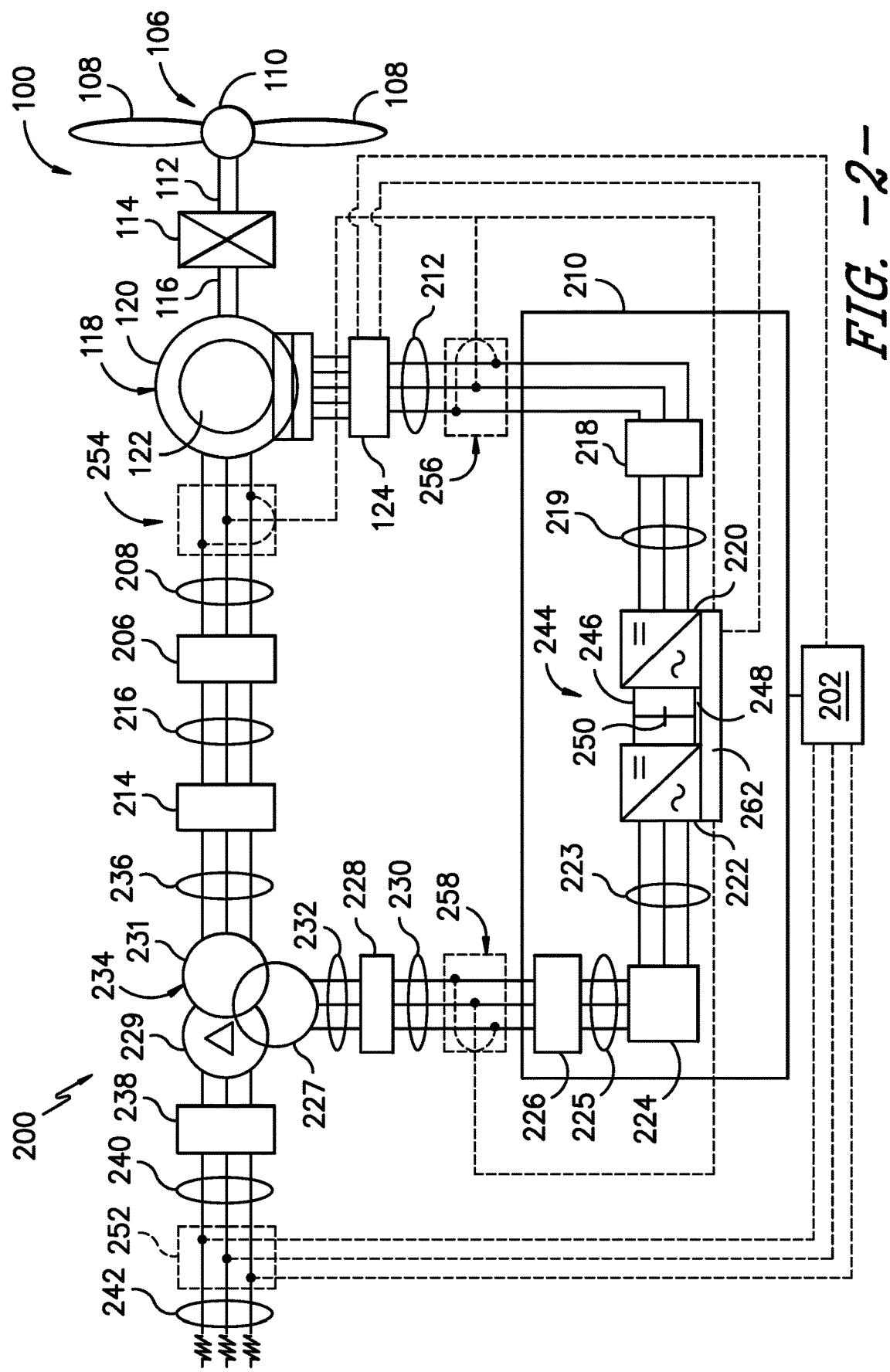
FIG. -2-

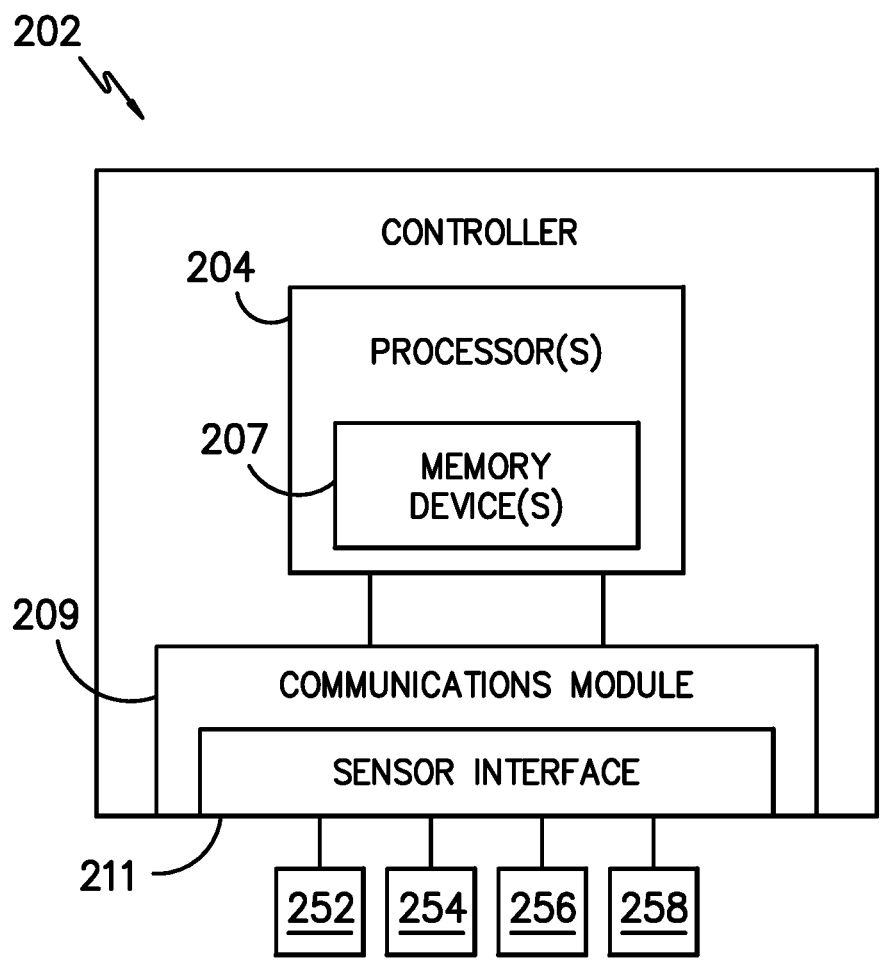
FIG. -3-

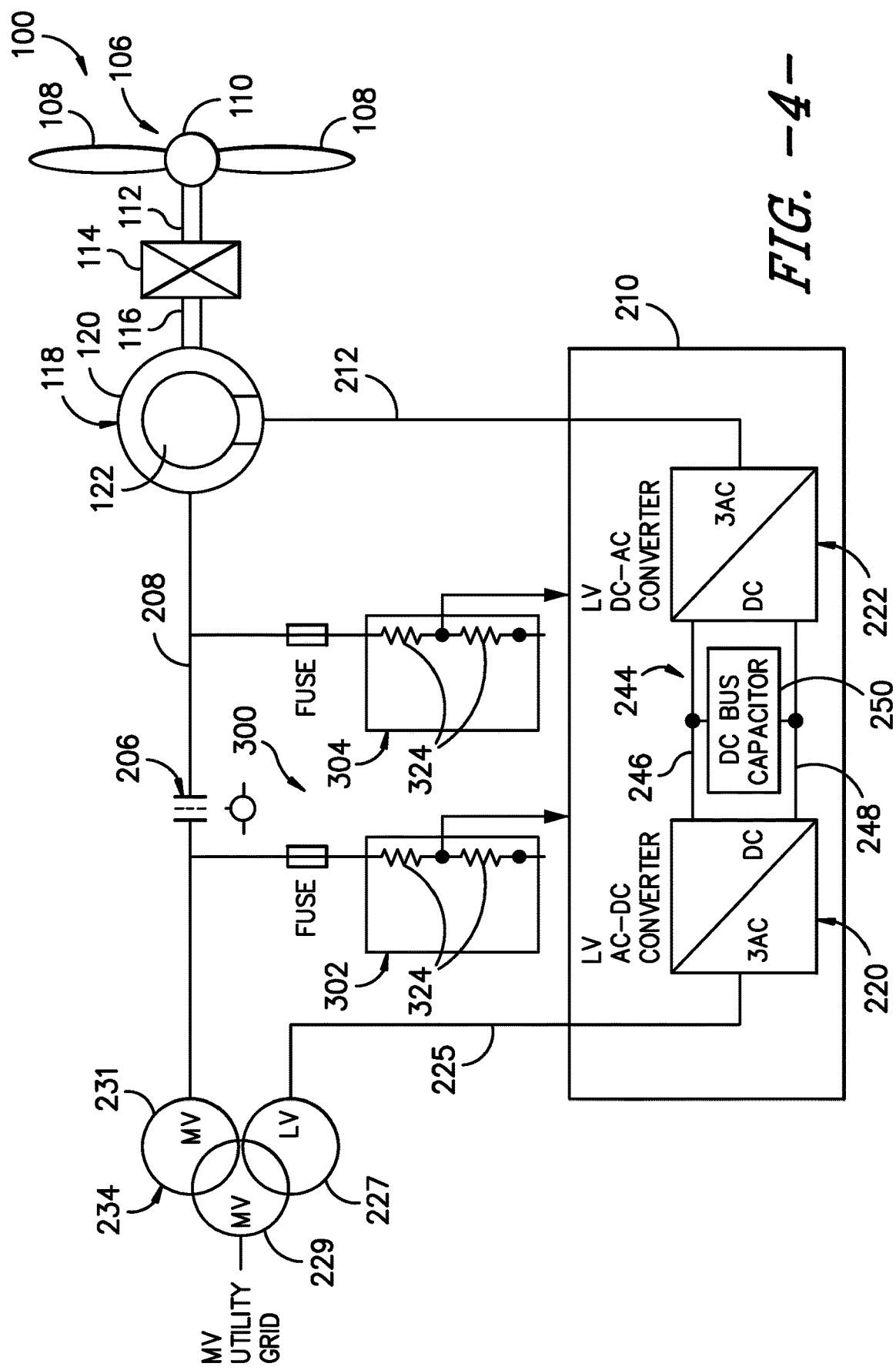
FIG. -4-

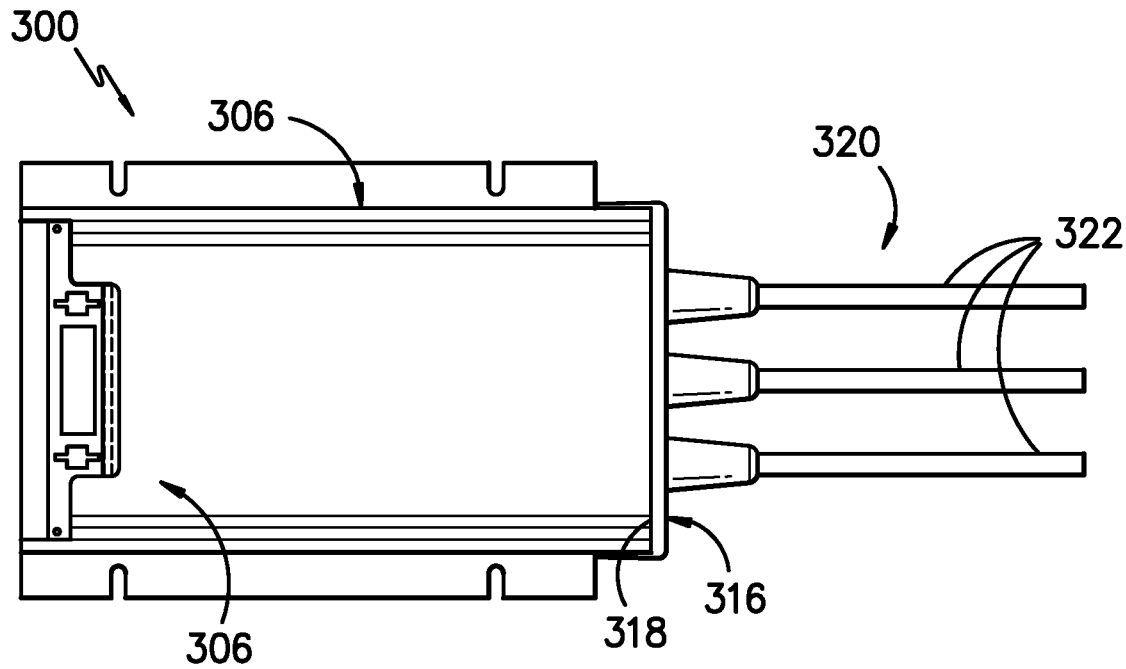
FIG. -5-
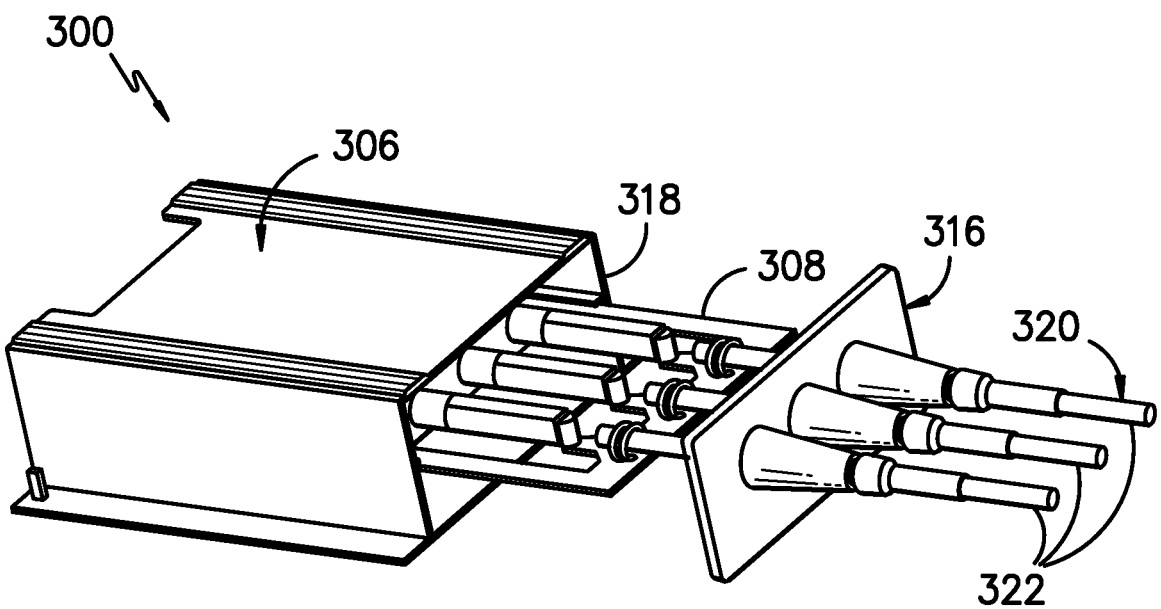
FIG. -6-

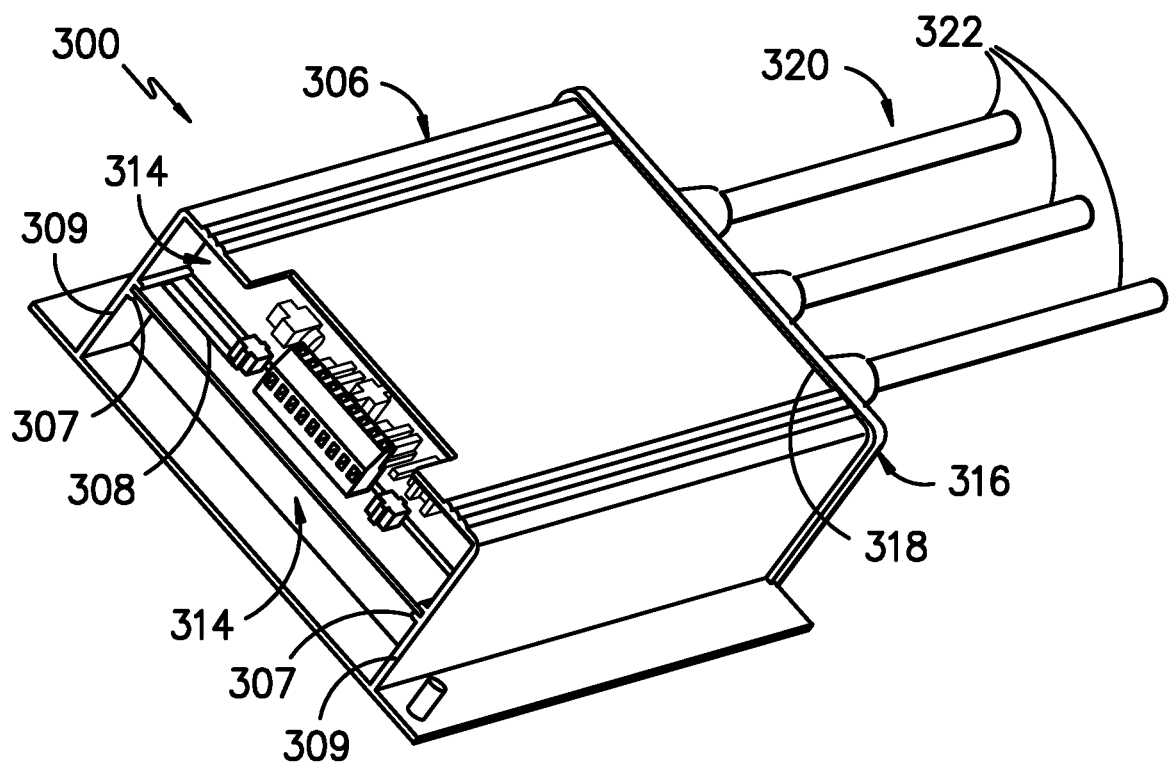
FIG. -7-
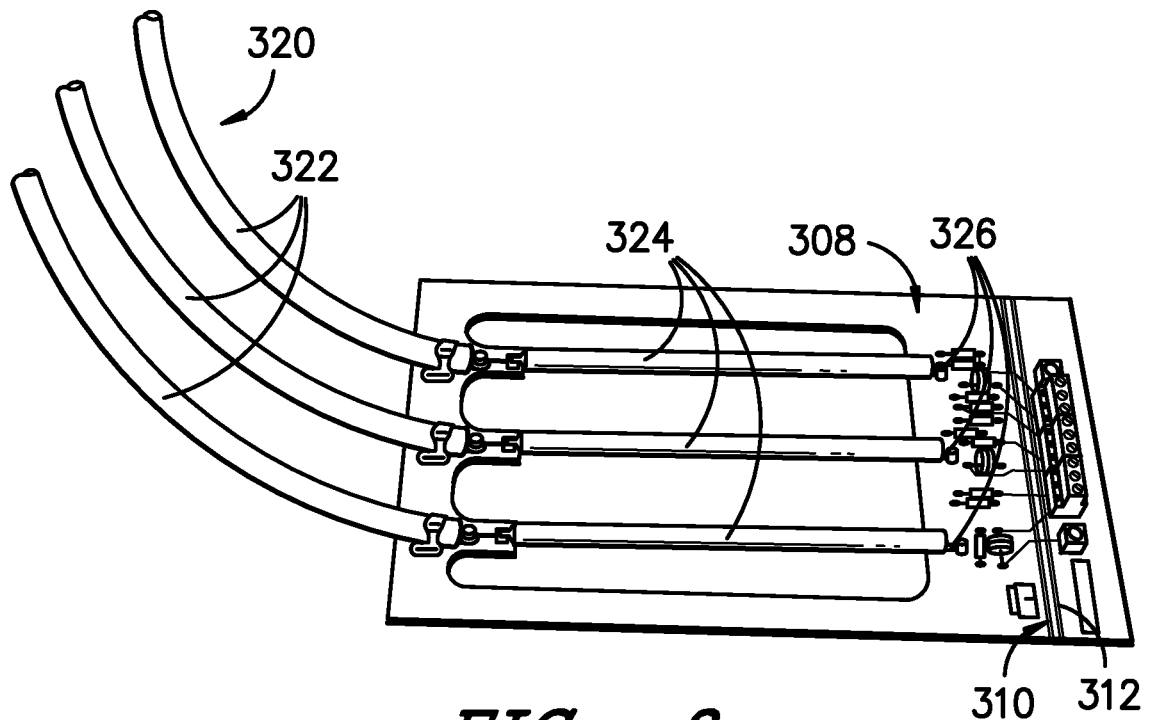
FIG. -8-

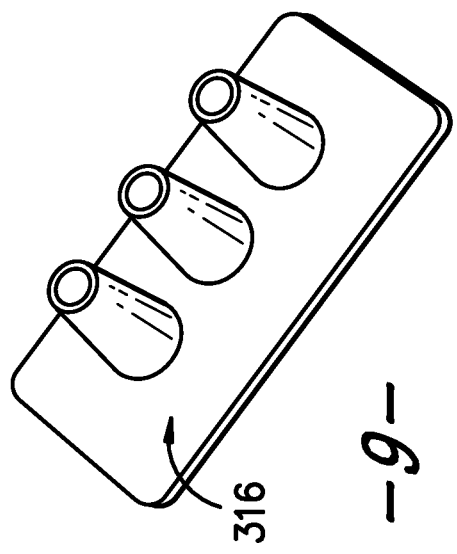
FIG. -9-
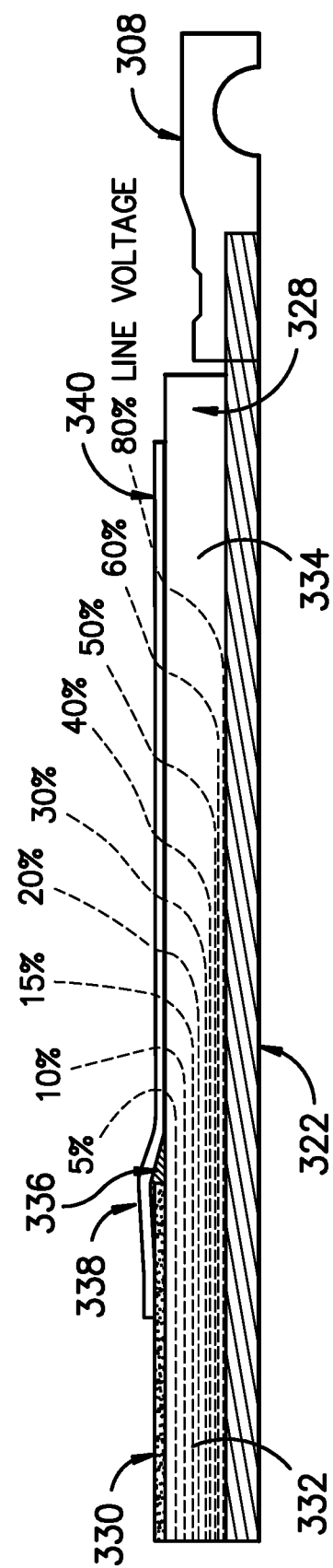
FIG. -10-

POWER ELECTRONICS ASSEMBLY HAVING A POTTED HIGH VOLTAGE ATTENUATOR CARD FOR A WIND TURBINE

FIELD

The present disclosure relates generally to wind turbines and, more particularly, to a power electronics assembly having a potted high voltage attenuator card for wind turbines.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

During operation, wind impacts the rotor blades and the blades transform wind energy into a mechanical rotational torque that rotatably drives a low-speed shaft. The low-speed shaft is configured to drive the gearbox that subsequently steps up the low rotational speed of the low-speed shaft to drive a high-speed shaft at an increased rotational speed. The high-speed shaft is generally rotatably coupled to a generator so as to rotatably drive a generator rotor. As such, a rotating magnetic field may be induced by the generator rotor and a voltage may be induced within a generator stator that is magnetically coupled to the generator rotor. The associated electrical power can be transmitted to a main transformer that is typically connected to a power grid via a grid breaker. Thus, the main transformer steps up the voltage amplitude of the electrical power such that the transformed electrical power may be further transmitted to the power grid.

In many wind turbines, the generator rotor may be electrically coupled to a bi-directional power converter that includes a rotor-side converter joined to a line-side converter via a regulated DC link. More specifically, some wind turbines, such as wind-driven doubly-fed induction generator (DFIG) systems or full power conversion systems, may include a power converter with an AC-DC-AC topology.

Many wind turbines may also include high voltage (HV) attenuator cards for coupling to the main transformer. Such HV attenuator cards, however, are large, complex, and expensive. In addition, there are difficulties associated with the attenuator cards successfully passing Basic Insulation Level (BIL) testing, e.g. due to arcing. More specifically, the enclosure of conventional HV attenuator cards includes many layers of insulation to withstand the high voltage. For example, numerous pieces of expensive insulators and spacers are required inside the enclosure between the circuit card and the mechanical housing. Moreover, silicone RTV may be applied in gaps and across exposed metal surfaces and screws. Conventional mechanical assemblies may also be difficult to manufacture to obtain repeatable consistent quality.

Thus, an apparatus for addressing the aforementioned issues would be welcomed in the art. Accordingly, the present disclosure is directed to a power electronics assembly having a potted high voltage attenuator card for wind turbines.

BRIEF DESCRIPTION

Aspects and advantages of the invention will be set forth in part in the following description, or may be obvious from the description, or may be learned through practice of the invention.

In one aspect, the present disclosure is directed to a power electronics assembly for a power generation system. The power electronics assembly includes a housing and an attenuator card positioned within the housing. The attenuator card may include at least one printed circuit board for a high-voltage attenuator circuit. The power electronics assembly also includes a potting material at least partially filling the housing on one or more sides of the attenuator card, a detachable end cap positioned at a first end of the housing, and multi-phase wiring communicatively coupled to the high-voltage attenuator circuit through the end cap.

In an embodiment, the detachable end cap may be constructed of a thermoplastic polymer. In another embodiment, the multi-phase wiring may be secured through the detachable end cap via heat shrink. In still another embodiment, the multi-phase wiring may be secured within the housing via a stress gradient mastic.

In further embodiments, the multi-phase wiring may include a plurality of conductors, with each of the plurality of conductors corresponding to a phase of the power generation system. In another embodiment, for example, the power generation system may be a three-phase system.

In an embodiment, the power electronics assembly may include an insulating layer at least partially surrounding each of the plurality of conductors, an insulation shield provided around a first portion of the insulating layer such that a second portion of the insulating layer is left exposed, a stress gradient mastic at an interface between the insulation shield and the insulating layer, and a stress control tube covering the stress gradient mastic and at least part of the second portion so as to dissipate electrical stress.

In additional embodiments, the power electronics assembly may include a resistor coupled with each of the plurality of conductors. In such embodiments, the power electronics assembly may also include an energy buffer coupled downstream of each of the resistors on the at least one printed circuit board. In certain embodiments, each of the resistors may be positioned within the housing.

In several embodiments, the housing may also include central corresponding grooves on side inner walls thereof. As such, the attenuator card is configured to sit within the central corresponding grooves. Moreover, in such embodiments, the potting material may be arranged on both sides of the attenuator card leaving terminals of the high-voltage attenuator circuit exposed for connections thereto. In particular embodiments, the potting material may include an epoxy or gel.

In certain embodiments, the power generation system may be a wind turbine power system.

In another aspect, the present disclosure is directed to an electrical power circuit. The electrical power circuit includes a generator having a rotor and a stator, a transformer connecting the electrical power circuit to an electrical grid, a power converter, and at least one power electronics assembly. The power converter includes a line-side converter electrically coupled to the transformer via a stator bus and a rotor-side converter electrically coupled to the rotor of the generator via a rotor bus. The power electronics assembly is coupled to the stator bus and the power converter. Further, the power electronics assembly includes a housing, an attenuator card positioned within the housing, a potting material, a detachable end cap, and multi-phase wiring. The attenuator card includes at least one printed circuit board for a high-voltage attenuator circuit. The potting material at least partially fills the housing on one or more sides of the attenuator card. The detachable end cap is positioned at a first end of the housing. Further, the multi-phase wiring is communicatively coupled to the high-voltage attenuator circuit through the end cap.

It should be understood that the electrical power circuit may be further configured with any of the additional features as described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a perspective view of a portion of one embodiment of a wind turbine according to the present disclosure;

FIG. 2 illustrates a schematic view of one embodiment of an electrical and control system suitable for use with the wind turbine shown in FIG. 1;

FIG. 3 illustrates a block diagram of one embodiment of a controller suitable for use with the wind turbine shown in FIG. 1;

FIG. 4 illustrates a schematic view of another embodiment of an electrical and control system suitable for use with the wind turbine shown in FIG. 1;

FIG. 5 illustrates a top view of one embodiment of the power electronics assembly according to the present disclosure;

FIG. 6 illustrates an exploded, perspective view of one embodiment of the power electronics assembly according to the present disclosure;

FIG. 7 illustrates a rear, perspective view of one embodiment of the power electronics assembly according to the present disclosure;

FIG. 8 illustrates a perspective view of one embodiment of a portion of the power electronics assembly according to the present disclosure;

FIG. 9 illustrates a perspective view of one embodiment of the detachable end cap of the power electronics assembly according to the present disclosure; and FIG. 10 illustrates a side view of one embodiment of one of the conductors of the power electronics assembly according to the present disclosure.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to a power electronics assembly having a housing, a high voltage attenuator circuit, a multi-phase high voltage input structure, and potting material between the circuit card and the mechanical housing. Moreover, the power electronics assembly may also include a special grade plastic end cap to aid with the electrical stress dissipation around the high voltage wiring and to by-pass electric fields of an alternating current (AC) voltage applied to the input structure. As such, the power electronics assembly is configured to power low voltage circuitries external to the mechanical assembly, thereby protecting the low voltage circuitries from the high voltage inputs. Such operation allows insulation of the high voltage from ground, safe isolation to keep the high voltage input from finding its way to the low voltage output, and freedom from partial discharge.

Referring now to the drawings, FIG. 1 illustrates a perspective view of a portion of an exemplary wind turbine 100 according to the present disclosure that is configured to implement the method and apparatus as described herein. The wind turbine 100 includes a nacelle 102 that typically houses a generator (not shown). The nacelle 102 is mounted on a tower 104 having any suitable height that facilitates operation of wind turbine 100 as described herein. The wind turbine 100 also includes a rotor 106 that includes three blades 108 attached to a rotating hub 110. Alternatively, the wind turbine 100 may include any number of blades 108 that facilitates operation of the wind turbine 100 as described herein.

Referring to FIG. 2, a schematic view of an exemplary electrical and control system 200 (also referred to herein as an electrical power circuit) that may be used with the wind turbine 100 is illustrated. During operation, wind impacts the blades 108 and the blades 108 transform wind energy into a mechanical rotational torque that rotatably drives a low-speed shaft 112 via the hub 110. The low-speed shaft 112 is configured to drive a gearbox 114 that subsequently steps up the low rotational speed of the low-speed shaft 112 to drive a high-speed shaft 116 at an increased rotational speed. The high-speed shaft 116 is generally rotatably coupled to a generator 118 so as to rotatably drive a generator rotor 122. In one embodiment, the generator 118 may be a wound rotor, three-phase, double-fed induction (asynchronous) generator (DFIG) that includes a generator stator 120 magnetically coupled to a generator rotor 122. As such, a rotating magnetic field may be induced by the generator rotor 122 and a voltage may be induced within a generator stator 120 that is magnetically coupled to the generator rotor 122.

In one embodiment, the generator 118 is configured to convert the rotational mechanical energy to a sinusoidal, three-phase alternating current (AC) electrical energy signal in the generator stator 120. The associated electrical power can be transmitted to a main transformer 234 via a stator bus 208, a stator synchronizing switch 206, a system bus 216, a main transformer circuit breaker 214, and a generator-side bus 236. The main transformer 234 steps up the voltage amplitude of the electrical power such that the transformed electrical power may be further transmitted to a grid via a grid circuit breaker 238, a breaker-side bus 240, and a grid bus 242. In certain embodiments, as shown, the main transformer 224 may be a three-winding transformer having, for example, a low-voltage winding 227 and two medium-voltage windings 229, 231 (such as a medium-voltage primary winding 229 and a medium-voltage secondary winding 231). Thus, as shown, the stator bus 208 is coupled to one of the two medium-voltage windings 229.

In addition, the electrical and control system 200 may include a wind turbine controller 202 configured to control any of the components of the wind turbine 100. For example, as shown particularly in FIG. 3, the controller 202 may include one or more processor(s) 204 and associated memory device(s) 207 configured to perform a variety of computer-implemented functions (e.g., performing the methods, steps, calculations and the like and storing relevant data as disclosed herein). Additionally, the controller 202 may also include a communications module 209 to facilitate communications between the controller 202 and the various components of the wind turbine 100, e.g. any of the components of FIG. 2. Further, the communications module 209 may include a sensor interface 211 (e.g., one or more analog-to-digital converters) to permit signals transmitted from one or more sensors to be converted into signals that can be understood and processed by the processors 204. It should be appreciated that the sensors (e.g. sensors 252, 254, 256, 258) may be communicatively coupled to the communications module 209 using any suitable means. For example, as shown in FIG. 3, the sensors 252, 254, 256, 258 may be coupled to the sensor interface 211 via a wired connection. However, in other embodiments, the sensors 252, 254, 256, 258 may be coupled to the sensor interface 211 via a wireless connection, such as by using any suitable wireless communications protocol known in the art. As such, the processor 204 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 204 is also configured to compute advanced control algorithms and communicate to a variety of Ethernet or serial-based protocols (Modbus, OPC, CAN, etc.). Additionally, the memory device(s) 207 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 207 may generally be configured to store suitable computer-readable instructions that, when implemented by the processor(s) 204, configure the controller 202 to perform the various functions as described herein.

Referring back to FIG. 2, the generator stator 120 may be electrically coupled to a stator synchronizing switch 206 via a stator bus 208. In one embodiment, to facilitate the DFIG configuration, the generator rotor 122 has rotor connections 124 that are electrically coupled to a bi-directional power conversion assembly 210 or power converter via a rotor bus 212. Alternatively, the generator rotor 122 may be electrically coupled to the rotor bus 212 via any other device that facilitates operation of electrical and control system 200 as described herein. In a further embodiment, the stator synchronizing switch 206 may be electrically coupled to a main transformer circuit breaker 214 via a system bus 216.

The power conversion assembly 210 may include a rotor filter 218 that is electrically coupled to the generator rotor 122 via the rotor bus 212. In addition, the rotor filter 218 may include a rotor-side reactor. A rotor filter bus 219 electrically couples the rotor filter 218 to a rotor-side power converter 220. Further, the rotor-side power converter 220 may be electrically coupled to a line-side power converter 222 via a single direct current (DC) link 244. Alternatively, the rotor-side power converter 220 and the line-side power converter 222 may be electrically coupled via individual and separate DC links. In addition, as shown, the DC link 244 may include a positive rail 246, a negative rail 248, and at least one capacitor 250 coupled therebetween.

In addition, a line-side power converter bus 223 may electrically couple the line-side power converter 222 to a line filter 224. Also, a line bus 225 may electrically couple the line filter 224 to a line contactor 226. In addition, the line filter 224 may include a line-side reactor. Moreover, the line contactor 226 may be electrically coupled to a conversion circuit breaker 228 via a conversion circuit breaker bus 230. In addition, the conversion circuit breaker 228 may be electrically coupled to the main transformer circuit breaker 214 via system bus 216 and a connection bus 232. The main transformer circuit breaker 214 may be electrically coupled to an electric power main transformer 234 via a generator-side bus 236. The main transformer 234 may be electrically coupled to a grid circuit breaker 238 via a breaker-side bus 240. The grid circuit breaker 238 may be connected to the electric power transmission and distribution grid via a grid bus 242.

In operation, alternating current (AC) power generated at the generator stator 120 by rotation of the rotor 106 is provided via a dual path to the grid bus 242. The dual paths are defined by the stator bus 208 and the rotor bus 212. On the rotor bus side 212, sinusoidal multi-phase (e.g. three-phase) AC power is provided to the power conversion assembly 210. The rotor-side power converter 220 converts the AC power provided from the rotor bus 212 into DC power and provides the DC power to the DC link 244. Switching elements (e.g. IGBTs) used in bridge circuits of the rotor side power converter 220 can be modulated to convert the AC power provided from the rotor bus 212 into DC power suitable for the DC link 244.

The line side converter 222 converts the DC power on the DC link 244 into AC output power suitable for the electrical grid bus 242. In particular, switching elements (e.g. IGBTs) used in bridge circuits of the line side power converter 222 can be modulated to convert the DC power on the DC link 244 into AC power on the line side bus 225. The AC power from the power conversion assembly 210 can be combined with the power from the stator 120 to provide multi-phase power (e.g. three-phase power) having a frequency maintained substantially at the frequency of the electrical grid bus 242 (e.g. 50 Hz/60 Hz). It should be understood that the rotor-side power converter 220 and the line-side power converter 222 may have any configuration using any switching devices that facilitate operation of electrical and control system 200 as described herein.

Further, the power conversion assembly 210 may be coupled in electronic data communication with the turbine controller 202 and/or a separate or integral converter controller 262 to control the operation of the rotor-side power converter 220 and the line-side power converter 222. For example, during operation, the controller 202 may be configured to receive one or more voltage and/or electric current measurement signals from the first set of voltage and electric current sensors 252. Thus, the controller 202 may be configured to monitor and control at least some of the operational variables associated with the wind turbine 100 via the sensors 252. In the illustrated embodiment, each of the sensors 252 may be electrically coupled to each one of the three phases of the power grid bus 242. Alternatively, the sensors 252 may be electrically coupled to any portion of electrical and control system 200 that facilitates operation of electrical and control system 200 as described herein. In addition to the sensors described above, the sensors may also include a second set of voltage and electric current sensors 254, a third set of voltage and electric current sensors 256, a fourth set of voltage and electric current sensors 258 (all shown in FIG. 2), and/or any other suitable sensors.

It should also be understood that any number or type of voltage and/or electric current sensors may be employed within the wind turbine 100 and at any location. For example, the sensors may be current transformers, shunt sensors, rogowski coils, Hall Effect current sensors, Micro Inertial Measurement Units (MIMUs), or similar, and/or any other suitable voltage or electric current sensors now known or later developed in the art.

Thus, the converter controller 262 is configured to receive one or more voltage and/or electric current feedback signals from the sensors 252, 254, 256, 258. More specifically, in certain embodiments, the current or voltage feedback signals may include at least one of line current feedback signals, line-side converter feedback signals, rotor-side converter feedback signals, stator current feedback signals, line voltage feedback signals, or stator voltage feedback signals. For example, as shown in the illustrated embodiment, the converter controller 262 receives voltage and electric current measurement signals from the second set of voltage and electric current sensors 254 coupled in electronic data communication with stator bus 208. The converter controller 262 may also receive the third and fourth set of voltage and electric current measurement signals from the third and fourth set of voltage and electric current sensors 256, 258. In addition, the converter controller 262 may be configured with any of the features described herein in regards to the main controller 202. Further, the converter controller 262 may be separate from or integral with the main controller 202. As such, the converter controller 262 is configured to implement the various method steps as described herein and may be configured similar to the turbine controller 202.

Referring now to FIG. 4, a simplified, schematic view of the simplified electrical and control system 200 that may be used with the wind turbine 100 is illustrated. More particularly, as shown, the electrical and control system 200 includes at least one power electronics assembly 300 according to the present disclosure. For example, as shown, the electrical and control system 200 includes two power electronics assemblies 300, namely a first power electronics assembly 302 and a second power electronics assembly 304. Thus, as shown, the first power electronics assembly 302 may be coupled to the stator bus 208 on a first side of the medium voltage synchronization switch 206, whereas the second power electronics assembly 304 may be coupled to the stator bus 208 on an opposing, second side of the medium voltage synchronization switch 206. In such embodiments, the first and second power electronics assemblies 302, 304 are configured to sense the 6 KV voltage of the stator at both sides of the synchronization switch 206 so as to reduce that voltage to a safe low voltage signal input for the converter.

Referring now to FIGS. 5-9, various views of one embodiment of the components of the power electronics assembly 300 for a power generation system is illustrated according to the present disclosure. FIG. 5 illustrates a top view of the power electronics assembly 300 according to the present disclosure. FIG. 6 illustrates an exploded, perspective view of the power electronics assembly 300 according to the present disclosure. FIG. 7 illustrates a rear, perspective view of the power electronics assembly 300 according to the present disclosure. More specifically, as shown, the power electronics assembly 300 includes a housing 306 and an attenuator card 308 positioned within the housing 306. In an embodiment, for example, the housing 306 may be an extruded, metal housing.

As shown particularly in FIG. 8, the attenuator card 308 may include at least one printed circuit board 310 having a high-voltage attenuator circuit 312 printed thereon. Further, as shown in FIG. 7, the power electronics assembly 300 also includes a potting material 314 at least partially filling the housing 306 on one or more sides of the attenuator card 308. Thus, the potting material 314 allows for a more compact housing. For example, in particular embodiments, the potting material 314 may include an epoxy, gel, or any other suitable potting material. Moreover, in an embodiment, the potting material 314 may be translucent in color, such that the electrical connections can be easily viewed.

Referring still to FIG. 7, in an embodiment, the housing 306 may also include central corresponding grooves 307 on side inner walls 309 thereof. Thus, in such embodiments, the attenuator card 308 is configured to sit within the central corresponding grooves 307 within the housing 306. Moreover, in such embodiments, the potting material 314 may be arranged on both sides of the attenuator card 308, thereby leaving terminals of the high-voltage attenuator circuit 312 exposed for connections thereto.

Referring particularly to FIGS. 5, 6, and 9, the power electronics assembly 300 also includes a detachable end cap 316 positioned at a first end 318 of the housing 306. For example, in an embodiment, the detachable end cap 316 may be constructed of a special grade plastic, such as a thermoplastic polymer. In certain embodiments, the special grade plastic may contain a certain amount of electrically conductive materials (such as carbon) such that the overall resistivity of the plastic can be known and controlled. In particular embodiments, for example, the special grade plastic may include acrylonitrile butadiene styrene (ABS) or polycarbonate. Thus, the special grade plastic is configured to dissipate the electric field (E-field) associated with the incoming conductors (discussed below) to the housing 306 and thus to ground.

In addition, as shown in FIGS. 5-8, the power electronics assembly 300 includes multi-phase wiring 320 communicatively coupled to the high-voltage attenuator circuit 312, e.g. through the detachable end cap 316. Thus, in an embodiment, the multi-phase wiring 320 may be secured to and through the detachable end cap 316 via heat shrink, e.g. within the end cap 316 via a stress gradient mastic, as well as via any other suitable attachment methods. In further embodiments, as shown, the multi-phase wiring 320 may include a plurality of conductors 322, with each of the plurality of conductors 322 corresponding to a phase of the power generation system 200. Thus, as shown, for the three-phase system, the wiring includes three conductors 322. It should be understood that the power electronics assembly 300 may include any suitable number of conductors 322 including less than three and more than three.

In additional embodiments, as shown in FIGS. 4 and 8, the power electronics assembly 300 may also include a limiting resistor 324 coupled with each of the plurality of conductors 322. In such embodiments, as shown particularly in FIG. 8, the power electronics assembly 300 may also include an energy buffer 326 coupled downstream of each of the resistors 324 on the printed circuit board(s) 310. In certain embodiments, each of the resistors 324 may be positioned within the housing 306.

Referring now to FIG. 11, the power electronics assembly 300 may include an insulating layer 328 at least partially surrounding each of the plurality of conductors 322. Thus, as shown, the power electronics assembly 300 may also include an insulation shield 330 provided around a first portion 332 of the insulating layer 328 such that a second portion 334 of the insulating layer 328 is left exposed. Moreover, as shown, the power electronics assembly 300 may include a stress gradient mastic 336 at an interface 338 between the insulation shield 330 and the insulating layer 328. As such, the power electronics assembly 300 may further include a stress control tube 340 covering the stress gradient mastic 336 and at least part of the second portion 334 so as to dissipate electrical stress (as indicated by the dotted lines).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A power electronics assembly for a power generation system, comprising:
    a housing;
    an attenuator card positioned within the housing, the attenuator card comprising at least one printed circuit board for a high-voltage attenuator circuit;
    a potting material at least partially filling the housing on one or more sides of the attenuator card;
    a detachable end cap positioned at a first end of the housing;
    multi-phase wiring comprising a plurality of conductors communicatively coupled to the high-voltage attenuator circuit through the detachable end cap;
    a resistor coupled with each of the plurality of conductors; and
    an energy buffer coupled downstream of each of the resistors on the at least one printed circuit board.

2. The power electronics assembly of claim 1, wherein the detachable end cap is constructed of a thermoplastic polymer.

3. The power electronics assembly of claim 1, wherein the multi-phase wiring is secured through the detachable end cap via heat shrink within the housing via a stress gradient mastic.

4. The power electronics assembly of claim 1, wherein each of the plurality of conductors correspond to a phase of the power generation system, and wherein the power generation system is a three-phase system.

5. The power electronics assembly of claim 4, further comprising:
    an insulating layer at least partially surrounding each of the plurality of conductors;
    an insulation shield provided around a first portion of the insulating layer such that a second portion of the insulating layer is left exposed;
    a stress gradient mastic at an interface between the insulation shield and the insulating layer; and
    a stress control tube covering the stress gradient mastic and at least part of the second portion so as to dissipate electrical stress.

6. The power electronics assembly of claim 1, wherein each of the resistors is positioned within the housing.

7. The power electronics assembly of claim 1, wherein the housing comprises central corresponding grooves on side inner walls thereof, the attenuator card sitting within the central corresponding grooves.

8. The power electronics assembly of claim 7, wherein the potting material is arranged on both sides of the attenuator card leaving terminals of the high-voltage attenuator circuit exposed for connections thereto.

9. The power electronics assembly of claim 1, wherein the potting material comprises an epoxy or gel.

10. The power electronics assembly of claim 1, wherein the power generation system is a wind turbine power system.

11. An electrical power circuit, comprising:
    a generator having a rotor and a stator;
    a transformer connecting the electrical power circuit to an electrical grid;
    a power converter comprising a line-side converter electrically coupled to the transformer via a stator bus and a rotor-side converter electrically coupled to the rotor of the generator via a rotor bus; and
    at least one power electronics assembly coupled to the stator bus and the power converter, the at least one power electronics assembly comprising:
        a housing;
        an attenuator card positioned within the housing, the attenuator card comprising at least one printed circuit board for a high-voltage attenuator circuit;
        a potting material at least partially filling the housing on one or more sides of the attenuator card;
        a detachable end cap positioned at a first end of the housing;
        multi-phase wiring comprising a plurality of conductors communicatively coupled to the high-voltage attenuator circuit through the detachable end cap;
        a resistor coupled with each of the plurality of conductors; and
        an energy buffer coupled downstream of each of the resistors on the at least one printed circuit board.

12. The electrical power circuit of claim 11, wherein the transformer comprises a three-winding transformer, the three-winding transformer comprising a low-voltage winding and two medium-voltage windings, the stator bus being coupled to one of the two medium-voltage windings.

13. The electrical power circuit of claim 11, wherein the at least one power electronics assembly comprises a first power electronics assembly and a second power electronics assembly, wherein the first power electronics assembly is coupled to the stator bus on a first side of a medium voltage synchronization switch and the second power electronics assembly is coupled to the stator bus on an opposing, second side of the medium voltage synchronization switch.

14. The electrical power circuit of claim 11, wherein the detachable end cap is constructed of a thermoplastic polymer.

15. The electrical power circuit of claim 11, wherein the at least one power electronics assembly further comprises:
- an insulating layer at least partially surrounding each wire of the multi-phase wiring;
- an insulation shield provided around a first portion of the insulating layer such that a second portion of the insulating layer is left exposed;
- a stress gradient mastic at an interface between the insulation shield and the insulating layer; and
- a stress control tube covering the stress gradient mastic and at least part of the second portion so as to dissipate electrical stress.

16. The electrical power circuit of claim 11, wherein the electrical power circuit is part of a wind turbine power system.

* * * * *